(12) United States Patent
Petry et al.

(10) Patent No.: US 11,626,866 B2
(45) Date of Patent: *Apr. 11, 2023

(54) ELECTRONIC PERSISTENT SWITCH

(71) Applicant: ARRIS Enterprises LLC, Suwanee, GA (US)

(72) Inventors: Joseph Petry, Philadelphia, PA (US); Brian M. Carroll, Quakertown, PA (US)

(73) Assignee: ARRIS ENTERPRISES LLC, Suwanee, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/525,225

(22) Filed: Nov. 12, 2021

(65) Prior Publication Data

US 2022/0077847 A1 Mar. 10, 2022

Related U.S. Application Data

(63) Continuation of application No. 17/208,123, filed on Mar. 22, 2021, now Pat. No. 11,206,013, which is a
(Continued)

(51) Int. Cl.
*H03K 17/00* (2006.01)
*H03K 5/01* (2006.01)
(Continued)

(52) U.S. Cl.
CPC ............. *H03K 5/01* (2013.01); *H03K 17/22* (2013.01); *H03K 17/945* (2013.01); *H03K 17/96* (2013.01); *H03K 17/962* (2013.01); *H03K 19/20* (2013.01)

(58) Field of Classification Search
CPC ........ H03K 5/01; H03K 17/22; H03K 17/945; H03K 17/96; H03K 17/962; H03K 19/20
See application file for complete search history.

(56) References Cited

U.S. PATENT DOCUMENTS 4,502,146 A * 2/1985 D'Antonio ............. H03K 21/02
377/2
5,581,692 A 12/1996 Nevitt
(Continued)

OTHER PUBLICATIONS

International Preliminary Report on Patentability and Written Opinion on the International Searching Authority dated Dec. 14, 2021 in International (PCT) Application No. PCT/US2020/037737.
(Continued)

*Primary Examiner* — Tuan T Lam
(74) *Attorney, Agent, or Firm* — Wenderoth, Lind & Ponack, L.L.P.

(57) ABSTRACT

Methods, systems, and computer readable media described herein can be operable to facilitate transitioning a device from a first state to a second state. A switch described herein allows for the use of an electronic circuit to perform the toggle and persistence functions while simultaneously giving more flexibility to the industrial design and physical switch implementation. The switch allows this preserving of the state using only a toggle on a voltage and thus allowing for a hardware only solution. The switch described herein allows for the use of smaller and less complicated mechanical switches allowing for more compact industrial designs. The switch uses a programmable voltage reference as a 1 bit non-volatile memory cell that is programmed by means of a
(Continued)

logic pulse to the device. This allows a software independent setting of the state of the privacy switch. This state will remain through power cycles.

20 Claims, 4 Drawing Sheets

Related U.S. Application Data continuation of application No. 16/901,597, filed on Jun. 15, 2020, now Pat. No. 10,992,292.

(60) Provisional application No. 62/860,838, filed on Jun. 13, 2019.

(51) Int. Cl.
| | | |
|---|---|---|
| *H03K 19/20* | (2006.01) | |
| *H03K 17/96* | (2006.01) | |
| *H03K 17/945* | (2006.01) | |
| *H03K 17/22* | (2006.01) | |

(56) References Cited

U.S. PATENT DOCUMENTS

| | | | |
|---|---|---|---|
| 5,802,104 A * | 9/1998 | Thomas | H04L 27/2017 |
| | | | 375/222 |
| 5,912,617 A * | 6/1999 | Poletto | H03K 17/945 |
| | | | 73/304 R |
| 6,021,504 A | 2/2000 | Yamasaki | |
| 9,419,590 B2 | 8/2016 | Berzins | |
| 9,953,774 B2 * | 4/2018 | Liu | G06F 13/385 |
| 2002/0145449 A1 * | 10/2002 | Rivoir | H03M 9/00 |
| | | | 326/93 |
| 2005/0159122 A1 | 7/2005 | Mayer | |
| 2005/0174080 A1 | 8/2005 | Beckerman | |
| 2014/0075087 A1 | 3/2014 | Bartling | |
| 2015/0200652 A1 | 7/2015 | Berzins et al. | |
| 2016/0286613 A1 * | 9/2016 | Bayat | H05B 45/10 |
| 2020/0412072 A1 | 12/2020 | King | |

OTHER PUBLICATIONS

International Search Report dated Oct. 14, 2020 in International (PCT) Application No. PCT/US2020/037737.

* cited by examiner

ELECTRONIC PERSISTENT SWITCH

CROSS REFERENCE TO RELATED APPLICATION

This application is a non-provisional application claiming the benefit of U.S. application Ser. No. 17/208,123, entitled "Electronic Persistent Switch," which was filed Mar. 22, 2021, U.S. application Ser. No. 16/901,597, entitled "Electronic Persistent Switch," which was filed on Jun. 15, 2020 which claims the benefit of U.S. Provisional Application Ser. No. 62/860,838, entitled "Electronic Persistent Switch," which was filed on Jun. 13, 2019, and all of which are incorporated herein by reference in their entirety.

TECHNICAL FIELD

This disclosure relates to an electronic persistent switch.

BACKGROUND

Voice controlled systems are becoming more and more common and the feature is being included in many different applications around the home. With the prevalence of devices "listening" to consumers the need for a reliable privacy switch is apparent and not easily attainable. Ideally this privacy switch would not allow for any software control, meaning once a user places a device in privacy mode the device would remain in that state until the user physically placed the device back in to active mode. This state should also be kept through a power outage. In these types of applications form factor and industrial design are also a significant focus as products are marketed to a consumer. Mechanical switches to implement the privacy function tend to be bulky, have a different feel than most buttons and switches currently implemented or are difficult to implement and keep the desired Industrial design.

Previous solutions required either software controlled switches which lack concrete privacy requirements or latching or sliding switches that will remember the state through the mechanical design.

BRIEF DESCRIPTION OF THE DRAWINGS

Like reference numbers and designations in the various drawings indicate like elements.

DETAILED DESCRIPTION

In certain designs where security and privacy are a concern it may be advantageous to have a switch/setting that is preserved over a power cycle. Furthermore in terms of security and transparency it may also be advantageous to have this setting or switch be set without the intervention of any software running on the system. Two current methods are being used: (1) Non-Volatile memory storage and (2) Mechanical latching or positional switches.

Traditional methods of using Non-Volatile memory to save settings over a power cycle would use electronic flash memory or require the use of a battery to help store the current state. With current implementations the programming of non volatile storage always requires the use of some programming algorithm thus intervention from some software running on the system.

The switch described herein allows for the use of an electronic circuit to perform the toggle and persistence functions while simultaneously giving more flexibility to the industrial design and physical switch implementation. The switch allows this preserving of the state using only a toggle on a voltage and thus allowing for a hardware only solution. This solution described herein allows for the use of smaller and less complicated mechanical switches allowing for more compact industrial designs.

The switch uses a programmable voltage reference as a 1 bit non-volatile memory cell that is programmed by means of a logic pulse to the device. This allows a software independent setting of the state of the privacy switch. This state will remain through power cycles.

Figure 1:
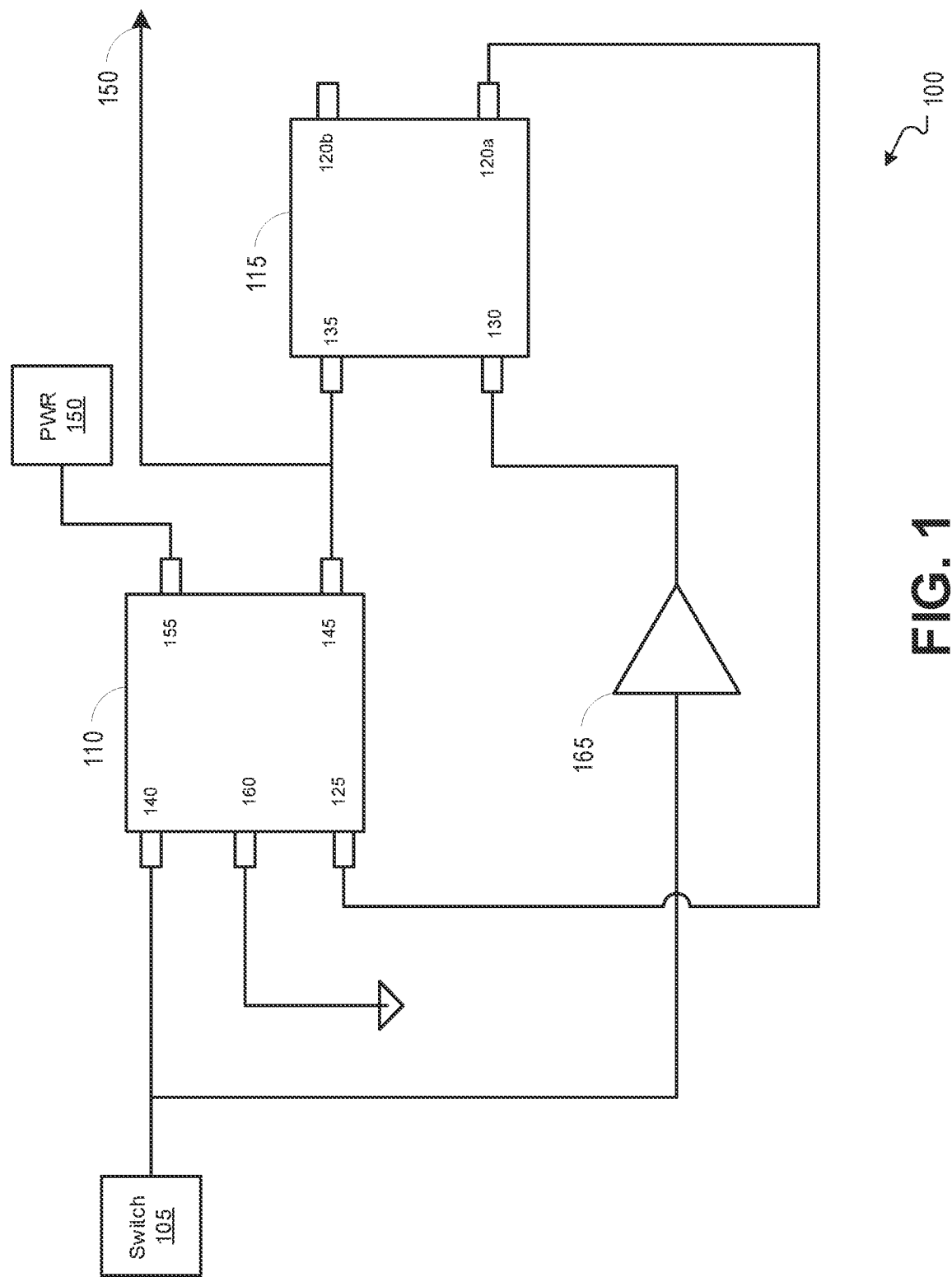
FIG. 1 shows an example schematic of an electrical switch.

Electrical Switch Implementation:
Uses a programmable voltage reference to generate a 1 bit non-volatile memory to remember the switch state
Voltage reference is "programmed" by means of a voltage pulse and requires no software control
Circuit will set the state of the switch and toggle that state on each press of the button FIG. 1 shows an example schematic of an electrical switch 100. As an example, the electrical switch 100 may integrated into a client or customer premise equipment (CPE) device having listening and/or video/image capture capabilities, or that is otherwise capable of outputting private user data.

In response to a button being pressed, a voltage pulse may be generated and output to one or more components of the electrical switch 100. For example, when a button is pressed, a switch 105 may be closed, thereby allowing the voltage pulse to be output to a programmable voltage reference 110 and/or a latch 115. The switch 105 drives a pulse to reprogram the voltage reference 110 to the alternate state generating the toggle.

The latch 115 is used to latch the inverted state and thus set the next state of the switch 100 while allowing the programming at the voltage reference 110 to correctly complete. In embodiments, when the voltage pulse is received by the latch 115, the latch 115 may toggle the state of the switch from a current state to an alternate state. For example, the latch 115 may be configured with a first state and a second state. The latch 115 may include a first voltage output pin 120a and a second voltage output pin 120b, wherein the first voltage output pin 120a is used to output a first voltage associated with a first state and the second voltage output pin 120b is used to output a second voltage associated with a second state. In response, to receiving the voltage pulse from the switch 105, the latch 115 may toggle the output from the first voltage output pin 120a to the second voltage output pin 120b, and vice versa. In embodiments, the latch 115 may be set to output a first voltage that is associated with a first state. The first voltage that is associated with the first state may be a different and/or alternate voltage than a second voltage that is associated with a second state. For example, the programmable voltage reference 110 may be set with and/or may be outputting the second voltage that is associated with the second state. In response to receiving the voltage pulse from the switch 105, the latch 115 may output the first voltage to the programmable voltage reference 110. For example, the programmable voltage reference 110 may receive the first voltage from the latch 115 through a voltage input pin 125. The latch 115 may receive the voltage pulse from the switch 105 via an input pin 130 (e.g., a CLK pin), and the latch 115 may be configured with a reference pin 135 to facilitate signaling between the latch 115 and the voltage reference 110.

The programmable voltage reference 110 may be used as a non-volatile memory. The programmable voltage reference 110 may be any element configured to permanently and persistently store a binary reference voltage. In embodiments, when the pressing of the switch 105 has ended (i.e., when the switch is released), and the switch 105 opens, the programmable voltage reference 110 may respond to the voltage pulse no longer being received from the switch 105. The programmable voltage reference 110 may detect the presence and/or absence of the voltage pulse via a switch pin 140. In response to the voltage pulse being terminated or removed, the programmable voltage reference 110 may store a persistent version of the voltage that is received from the latch 115. For example, the programmable voltage reference 110 may begin a periodic or constant output of the voltage received from the latch 115 through the voltage input pin 125, wherein the programmable voltage reference 110 outputs the voltage through the voltage output pin 145. The voltage output through the voltage output pin 145 is the persistent logic output 150 to be used to control privacy state (or other setting) at one or more elements of the device within which the switch 100 is integrated. For example, the voltage output through the voltage output pin 145 may enable or disable one or more privacy settings (e.g., microphone, camera, an output of private user data such as location data, etc.) of the device within which the switch 100 is integrated. This signal can be used in various implementations such as removing microphone power or disabling audio data paths in the design. In response to the voltage pulse being terminated, the programmable voltage reference 110 may adjust a persistently stored voltage to the voltage that was last received from the latch 115. The state will be stored in the voltage reference and remain persistent over a power cycle. The voltage reference 110 may receive power from a power source 150 (e.g., PWR) via a power input pin 155. The voltage reference 110 may include a ground pin 160.

In embodiments, when the voltage pulse is received by the programmable voltage reference 110, a reference voltage may be output to one or more logic gates, wherein the one or more logic gates control a feature or setting based upon the output that is received from the programmable voltage reference 110. For example, the programmable voltage reference 110 may be set to output a high reference voltage or a low reference voltage, depending upon the current state that is set at the latch 115 (e.g., the voltage state at the voltage reference may be the opposite state of the state set at the latch). It should be understood that the programmable voltage reference 110 may be configured to output a first voltage (e.g., high voltage) to enable a privacy setting (or other setting) and a second voltage (e.g., low voltage) to disable a privacy setting (or other setting). After outputting the reference voltage in response to receiving the voltage pulse, the programmable voltage reference 110 may adjust a reference voltage to reflect the alternate reference voltage. For example, the programmable voltage reference 110 may adjust a reference voltage to be output from the current reference voltage to the alternate reference voltage, and the adjusted reference voltage may be output by the programmable voltage reference 110 in response to receiving a next voltage pulse.

While a privacy setting is described herein, it should be understood that the programmable voltage reference 110 may be utilized to output a singular or a persistent signal or voltage to control a variety of settings, features, and/or states.

In embodiments, the voltage pulse output from the switch 105 to the latch 115 may pass through an inverter 165 that is located between the switch 105 and the latch 115.

Figure 2:
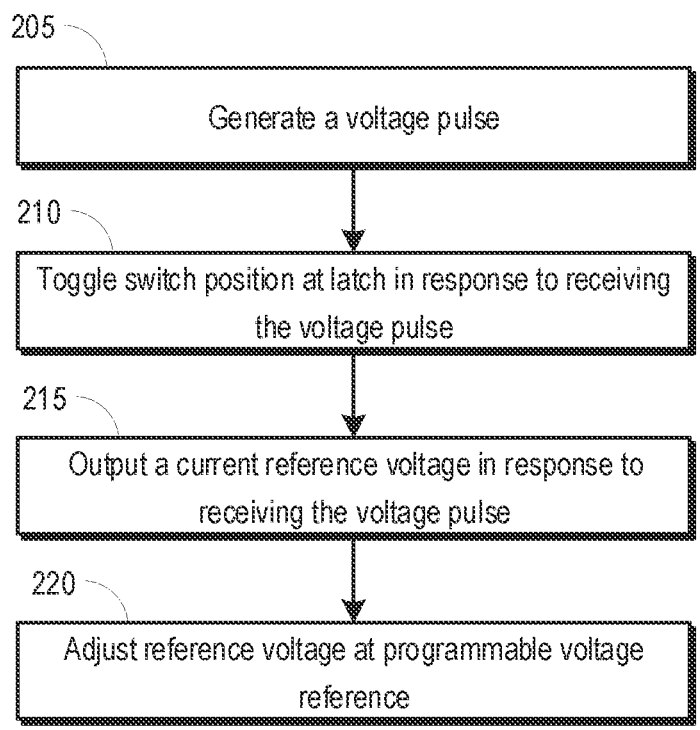
FIG. 2 shows an example process for transitioning from a first state to a second state.

It should be understood that the latch 115 may switch the voltage output from the first voltage output pin 120a to the second voltage output 120b (or vice versa) in response to the voltage pulse no longer being sensed by the latch 115. For example, the FIG. 2 shows an example process 200 for transitioning from a first state to a second state. A press of a button may cause the switch 105 of FIG. 1 to generate and output a voltage pulse. The voltage pulse may be received by the latch 115 of FIG. 1, and in response, the latch may toggle a switch position. A current reference voltage may be output (e.g., from the programmable voltage reference 110 of FIG. 1) in response to the voltage pulse being received. The reference voltage stored at the programmable voltage reference may be adjusted.

FIG. 2 shows an example process 200 for transitioning from a first state to a second state. A press of a button may cause the switch 105 of FIG. 1 to generate and output a voltage pulse. The voltage pulse may be received by the latch 115 of FIG. 1, and in response, the latch may toggle a switch position. A current reference voltage may be output (e.g., from the programmable voltage reference 110 of FIG. 1) in response to the voltage pulse being received. The reference voltage stored at the programmable voltage reference may be adjusted.

At 205, a voltage pulse may be generated. The voltage pulse may be generated, for example, by the switch 105 in response to a press of a button at the device.

At 210, a switch position may be toggled at a latch 115 in response to receiving the voltage pulse. For example, the voltage pulse generated at 205 may be output to and received at the latch 115. In response, the latch may toggle a switch position. For example, the switch may be toggled from a first position that outputs a first voltage from the latch to a second position that outputs a second voltage from the latch, wherein the voltages are output to the programmable voltage reference 110.

At 215, a current reference voltage may be output in response to receiving the voltage pulse. The current reference voltage may be the second voltage (e.g., the voltage currently being received from the latch 115), and the current reference voltage may be output from the programmable voltage reference 110. The current reference voltage may be output from the programmable voltage reference 110 in response to a release of the switch 105 (e.g., when the voltage pulse is no longer received by the programmable voltage reference).

At 220, the reference voltage at the programmable voltage reference 110 may be adjusted. For example, the reference voltage stored at the programmable voltage reference 110 may be adjusted from the current reference voltage (i.e., the first reference voltage) to an alternate reference voltage (e.g., the voltage received from the latch 115, in this case, the second reference voltage).

Figure 3:
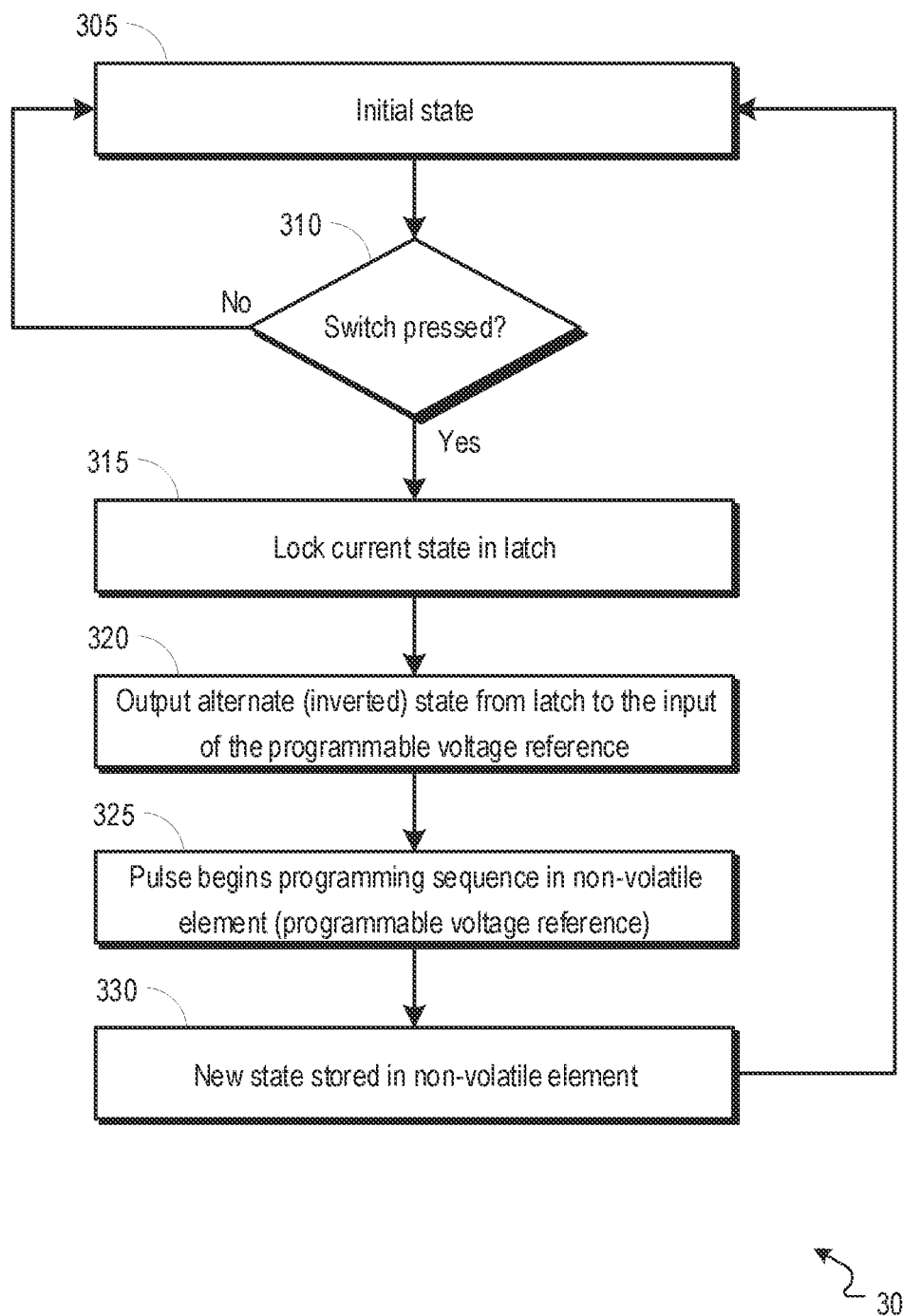
FIG. 3 shows an example process for transitioning from a first state to a second state in response to a switch or button being pressed.

FIG. 3 shows an example process 300 for transitioning from a first state to a second state in response to a switch or button being pressed. Starting at an initial state, in response to a button/switch being pressed: a current state may be locked at a volatile latch (e.g., latch 115 of FIG. 1); an alternate (inverted) state may be output from the volatile latch to an input of a programmable voltage reference 110 of FIG. 1; a pulse may begin a programming sequence in the non-volatile element (e.g., the programmable reference 110); and the new state may be stored in the non-volatile element.

At 305, a device may be operating in an initial state. For example, a voltage output from the programmable voltage reference 110 may control one or more settings at one or more elements of a device within which the switch 100 is integrated.

At 310, a determination may be made whether a switch at the device has been pressed. If the switch has not been pressed, the device may continue to operate at the initial state. If the switch has been pressed, the process 300 may proceed to 315.

At 315, a current state may be locked in a volatile latch 115. For example, upon receiving a voltage pulse resulting from the switch being pressed, the latch 115 may switch the output voltage from a current (i.e., first) voltage to an alternate (i.e., second) voltage.

At 320, the volatile latch 115 may output the alternate (i.e., inverted) voltage/state to an input of a programmable voltage reference 110.

At 325, a pulse may begin a programming sequence at a non-volatile element (e.g., a programmable reference 110). For example, when the switch is released, and the voltage pulse is no longer received by the programmable reference 110, the programmable reference may output the voltage that is received from the latch (e.g., the alternate voltage) to one or more logic gates.

At 330, the new state/voltage may be stored persistently in the non-volatile element (e.g., the programmable reference 110).

Figure 4:
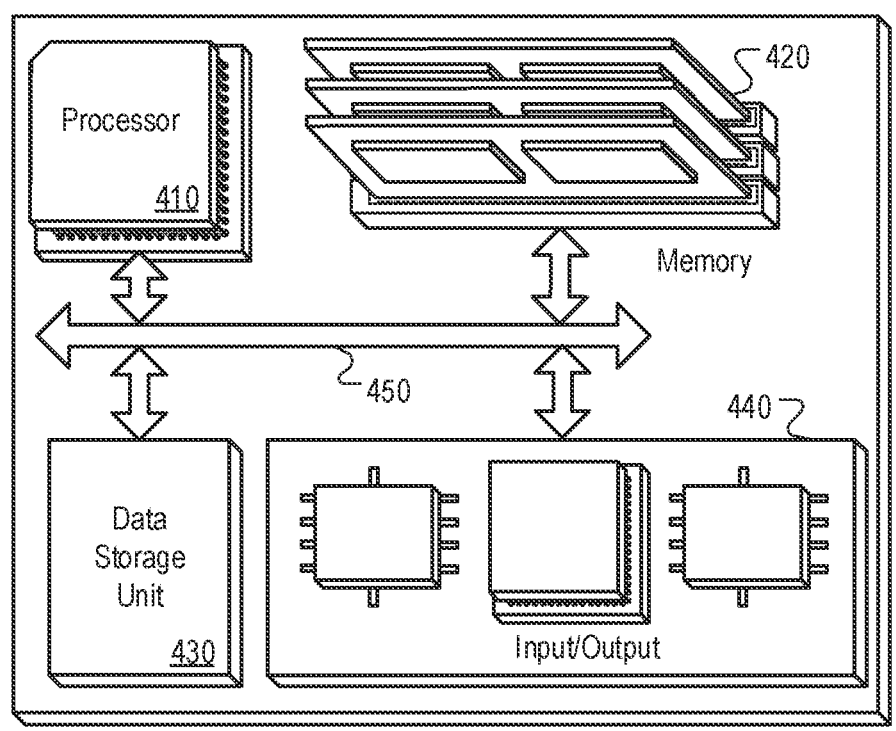
FIG. 4 is a block diagram of a hardware configuration operable to facilitate transitioning a device from a first state to a second state.

FIG. 4 is a block diagram of a hardware configuration 400 operable to facilitate transitioning a device from a first state to a second state. The hardware configuration 400 can include a processor 410, a memory 420, a storage device 430, and an input/output device 440. Each of the components 410, 420, 430, and 440 can, for example, be interconnected using a system bus 450. The processor 410 can be capable of processing instructions for execution within the hardware configuration 400. In one implementation, the processor 410 can be a single-threaded processor. In another implementation, the processor 410 can be a multi-threaded processor. The processor 410 can be capable of processing instructions stored in the memory 420 or on the storage device 430.

The memory 420 can store information within the hardware configuration 400. In one implementation, the memory 420 can be a computer-readable medium. In one implementation, the memory 420 can be a volatile memory unit. In another implementation, the memory 420 can be a non-volatile memory unit.

In some implementations, the storage device 430 can be capable of providing mass storage for the hardware configuration 400. In one implementation, the storage device 430 can be a computer-readable medium. In various different implementations, the storage device 430 can, for example, include a hard disk device, an optical disk device, flash memory or some other large capacity storage device. In other implementations, the storage device 430 can be a device external to the hardware configuration 400.

The input/output device 440 provides input/output operations for the hardware configuration 400. In one implementation, the input/output device 440 can include one or more of a network interface device (e.g., an Ethernet card), a serial communication device (e.g., an RS-232 port), one or more universal serial bus (USB) interfaces (e.g., a USB 2.0 port), one or more wireless interface devices (e.g., an 802.11 card), and/or one or more interfaces for outputting video and/or data services to a client device or display device associated with a client device. In another implementation, the input/output device can include driver devices configured to send communications to, and receive communications from one or more networks.

The subject matter of this disclosure, and components thereof, can be realized by instructions that upon execution cause one or more processing devices to carry out the processes and functions described above. Such instructions can, for example, comprise interpreted instructions, such as script instructions, e.g., JavaScript or ECMAScript instructions, or executable code, or other instructions stored in a computer readable medium.

Implementations of the subject matter and the functional operations described in this specification can be provided in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible program carrier for execution by, or to control the operation of, data processing apparatus.

A computer program (also known as a program, software, software application, script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification are performed by one or more programmable processors executing one or more computer programs to perform functions by operating on input data and generating output thereby tying the process to a particular machine (e.g., a machine programmed to perform the processes described herein). The processes and logic flows can also be performed by, and apparatus can also be implemented as, special purpose logic circuitry, e.g., an FPGA (field programmable gate array) or an ASIC (application specific integrated circuit).

Computer readable media suitable for storing computer program instructions and data include all forms of non-volatile memory, media and memory devices, including by way of example semiconductor memory devices (e.g., EPROM, EEPROM, and flash memory devices); magnetic disks (e.g., internal hard disks or removable disks); magneto optical disks; and CD ROM and DVD ROM disks. The processor and the memory can be supplemented by, or incorporated in, special purpose logic circuitry.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter described in this specification have been described. Other embodiments are within the scope of the following claims. For example, the actions recited in the claims can be performed in a different order and still achieve desirable results, unless expressly noted otherwise. As one example, the processes depicted in the accompanying figures do not necessarily require the particular order shown, or sequential order, to achieve desirable results. In some implementations, multitasking and parallel processing may be advantageous.

We claim:

1. A method for transitioning from a first state of a device to a second state of the device, the method comprising:
   generating a voltage pulse;
   receiving, at a latch, the voltage pulse;
   receiving at a programmable voltage reference element the voltage pulse;
   toggling from a first switch position to a second switch position at the latch in response to the voltage pulse being received at the latch, wherein the latch outputs a first voltage at the first switch position and a second voltage at the second switch position;
   outputting a current reference voltage from the programmable voltage reference element in response to receiving the voltage pulse from a switch and the second voltage from the latch, wherein the current reference voltage comprises the second voltage;
   adjusting a reference voltage at the programmable voltage reference element, wherein the reference voltage is adjusted from the first voltage to the second voltage; and
   storing a state in the reference voltage, wherein the state remains persistent over a power cycle.

2. The method of claim 1, wherein at least one of:
   the voltage pulse received at the latch passes through an inverter located between the switch and the latch; and
   the voltage pulse is generated in response to a button being pressed at the device.

3. The method of claim 1, wherein the current reference voltage is output to one or more logic gates.

4. The method of claim 3, wherein the one or more logic gates control a setting at the device.

5. The method of claim 4, wherein the setting comprises a privacy setting.

6. The method of claim 1, wherein the current reference voltage is output from the programmable voltage reference element in response to the voltage pulse no longer being received at the programmable voltage reference element.

7. The electrical switch of claim 1, wherein the voltage pulse passes through an inverter located between the electrical switch and the latch prior to being received at the latch.

8. An electrical switch that:
   generates a voltage pulse;
   receives, at a latch, the voltage pulse;
   receives at a programmable voltage reference element the voltage pulse;
   toggles from a first switch position to a second switch position at the latch in response to the voltage pulse being received at the latch, wherein the latch outputs a first voltage at the first switch position and a second voltage at the second switch position;
   outputs a current reference voltage from the programmable voltage reference element in response to receiving the voltage pulse from a switch and the second voltage from the latch, wherein the current reference voltage comprises the second voltage;
   adjusts a reference voltage at the programmable voltage reference element, wherein the reference voltage is adjusted from the first voltage to the second voltage; and
   stores a state in the reference voltage, wherein the state remains persistent over a power cycle.

9. The electrical switch of claim 8, wherein the voltage pulse is generated in response to a button being pressed.

10. The electrical switch of claim 8, wherein the current reference voltage is output to one or more logic gates.

11. The electrical switch of claim 10, wherein the one or more logic gates control a setting at one or more elements.

12. The electrical switch of claim 11, wherein the setting comprises a privacy setting.

13. The electrical switch of claim 8, wherein the current reference voltage is output from the programmable voltage reference element in response to the voltage pulse no longer being received at the programmable voltage reference element.

14. The electrical switch of claim 8, wherein the programmable voltage reference element includes a ground pin.

15. One or more non-transitory computer readable media having instructions operable to cause one or more processors to perform the operations comprising:
   generating a voltage pulse;
   receiving, at a latch, the voltage pulse;
   receiving at a programmable voltage reference element the voltage pulse;
   toggling from a first switch position to a second switch position at the latch in response to the voltage pulse being received at the latch, wherein the latch outputs a first voltage at the first switch position and a second voltage at the second switch position;

outputting a current reference voltage from the programmable voltage reference element in response to receiving the voltage pulse from a switch and the second voltage from the latch, wherein the current reference voltage comprises the second voltage;

adjusting a reference voltage at the programmable voltage reference element, wherein the reference voltage is adjusted from the first voltage to the second voltage; and storing a state in the reference voltage, wherein the state remains persistent over a power cycle.

16. The one or more non-transitory computer readable media of claim 15, wherein at least one of:

the voltage pulse received at the latch passes through an inverter located between the switch and the latch; and the voltage pulse is generated in response to a button being pressed at the device.

17. The one or more non-transitory computer readable media of claim 15, wherein the current reference voltage is output to one or more logic gates.

18. The one or more non-transitory computer readable media of claim 17, wherein the one or more logic gates control a setting at the device.

19. The one or more non-transitory computer readable media of claim 18, wherein the setting comprises a privacy setting.

20. The one or more non-transitory computer readable media of claim 15, wherein the current reference voltage is output from the programmable voltage reference element in response to the voltage pulse no longer being received at the programmable voltage reference element.

* * * * *